United States Patent
Mizukoshi et al.

(10) Patent No.: US 7,982,693 B2
(45) Date of Patent: Jul. 19, 2011

(54) OLED DISPLAY APPARATUS

(75) Inventors: Seiichi Mizukoshi, Kanagawa (JP);
Nobuyuki Mori, Saitama (JP); Makoto Kohno, Tsuzuki-ku (JP)

(73) Assignee: Global OLED Technology LLC, Herndon, VA (US)

( * ) Notice: Subject to any disclaimer, the term of this patent is extended or adjusted under 35 U.S.C. 154(b) by 490 days.

(21) Appl. No.: 11/570,093

(22) PCT Filed: Jun. 6, 2005

(86) PCT No.: PCT/US2005/019811
§ 371 (c)(1),
(2), (4) Date: Dec. 6, 2006

(87) PCT Pub. No.: WO2006/001988
PCT Pub. Date: Jan. 5, 2006

(65) Prior Publication Data
US 2008/0297448 A1      Dec. 4, 2008

(30) Foreign Application Priority Data
Jun. 15, 2004   (JP) ................... 2004-177658

(51) Int. Cl.
*G09G 3/30*   (2006.01)
(52) U.S. Cl. ............................. 345/76; 345/77; 345/589
(58) Field of Classification Search .............. 345/76–77, 345/589
See application file for complete search history.

(56) References Cited

U.S. PATENT DOCUMENTS

| | | | |
|---|---|---|---|
| 5,032,903 A * | 7/1991 | Suzuki et al. | 358/530 |
| 5,237,400 A * | 8/1993 | Washio et al. | 358/518 |
| 5,754,457 A * | 5/1998 | Eitan et al. | 708/402 |
| 5,760,922 A * | 6/1998 | Kojima | 358/464 |
| 6,118,484 A * | 9/2000 | Yokota et al. | 348/350 |
| 6,771,028 B1* | 8/2004 | Winters | 315/169.1 |
| 6,771,835 B2* | 8/2004 | Han et al. | 382/260 |
| 2002/0057238 A1* | 5/2002 | Nitta et al. | 345/87 |
| 2002/0186214 A1* | 12/2002 | Siwinski | 345/212 |
| 2004/0046725 A1 | 3/2004 | Lee | |
| 2004/0178743 A1* | 9/2004 | Miller et al. | 315/169.3 |
| 2004/0178973 A1 | 9/2004 | Miller et al. | |
| 2004/0178974 A1 | 9/2004 | Miller et al. | |
| 2004/0263528 A1* | 12/2004 | Murdoch et al. | 345/600 |
| 2005/0030264 A1* | 2/2005 | Tsuge et al. | 345/76 |
| 2005/0052446 A1* | 3/2005 | Plut | 345/211 |
| 2005/0083344 A1* | 4/2005 | Higgins | 345/600 |
| 2006/0098077 A1* | 5/2006 | Dowling | 347/130 |
| 2007/0080905 A1* | 4/2007 | Takahara | 345/76 |

FOREIGN PATENT DOCUMENTS

JP   2000-200061   7/2000
(Continued)

*Primary Examiner* — Richard Hjerpe
*Assistant Examiner* — Dorothy Harris
(74) *Attorney, Agent, or Firm* — Morgan, Lewis & Bockius LLP

(57) ABSTRACT

An organic light emitting diode (OLED) display apparatus having four types of light producing dots, including R (red), G (green), B (blue), and W (white) dots, includes detecting the amount of high frequency components of a portion of a color image to be displayed, or calculating average brightness or power of display from input image data; or detecting the amount of current flowing in display; or responding to a user input instruction; or responding to a battery capacity; and adaptively changing the usage ratio of W dots accordingly.

11 Claims, 16 Drawing Sheets

FOREIGN PATENT DOCUMENTS

| | | | |
|---|---|---|---|
| JP | 2000200061 A * | 7/2000 | |
| JP | 2002-123208 A | 4/2002 | |
| JP | 2002-229531 A | 8/2002 | |
| JP | 2004-102292 A | 4/2004 | |
| WO | 00/11728 | 3/2000 | |
| WO | WO 03/001498 A1 | 3/2003 | |

* cited by examiner

OLED DISPLAY APPARATUS

FIELD OF THE INVENTION

The present invention relates to driving an OLED (Organic Light Emitting Diode) display apparatus, having red, green, blue and white light producing dots using an organic light emitting diode (OLED) or an organic electroluminescence (OEL) element, and more particularly to effective driving of such an apparatus.

BACKGROUND OF THE INVENTION

FIG. 1 shows an example dot array of a matrix type OLED panel in which three dots, namely the typical R (red), G (green), and B (blue) dots, form one color pixel. FIG. 2 shows an example dot array in which, in addition to the RGB dots, W (white) dots are also provided.

The RGBW type display apparatuses, which additionally include W dots, consume less power and are brighter because the W dots have higher emission efficiency than RGB dots.

Methods for realizing such RGBW panels can be divided into types: methods which employ OLED emitting each of RGBW colors provided for each dot; and methods which employ white OLEDs and RGB optical filters (color filters) superposed on dots other than W dots, as described in Japanese Patent Laid-Open Publication No. 2003-178875, for example.

FIG. 3, which shows a CIE (Commision Internationale de l'Eclairage) 1931 chromaticity diagram, shows an example chromaticity of W primary color for use as a white dot along with three primary RGB colors. Here, the chromaticity of this W primary color need not necessarily correspond to the reference white color of a display.

FIG. 4 shows a method of converting an RGB input signal which can display reference white color of a display when R=1, G=1, and B=1, into an RGBW image signal.

First, when the W primary color does not correspond to the reference white color of the display, the following calculation is applied to an input RGB signal for normalization to the W primary color.

$$\begin{pmatrix} Rn \\ Gn \\ Bn \end{pmatrix} = \begin{pmatrix} a & 0 & 0 \\ 0 & b & 0 \\ 0 & 0 & c \end{pmatrix} \times \begin{pmatrix} R \\ G \\ B \end{pmatrix} \quad (1)$$

In the above expression, R, G, and B represent input signals; Rn, Gn, and Bn represent red, green, and blue signals normalized to W primary color, respectively; and a, b, and c are coefficients which are selected such that brightness and chromaticity equal to W=1 can be obtained when R=1/a, G=1/b, and B=1/c are output.

Then, from Rn, Gn, and Bn, S=F1 (Rn, Gn, Bn) which is used for obtaining values for W dot display, is calculated. Then, based on the calculated value of S, a correction amount F2(S) concerning RGB and a value F3(S) concerning W are calculated.

The correction amount F2(S) is added to each value of RGB to obtain Rn', Gn', and Bn' which are RGB values for achieving RGBW display. On the other hand, the value F3(S) is output unchanged as a W value.

In other word, Rn', Gn', Bn', and W can now be obtained, from S=F1(Rn, Gn, Bn), Rn'=Rn+F2(S), Gn'=Gn+F2(S), Bn'=Bn+F2(S), and W=F3(S) calculated as described above. Similarly, the final process of normalization of Rn', Bn', and Gn' to the reference white color is performed when the W primary color does not correspond to the reference white color of display, by means of the following calculation. This process is performed only as required.

$$\begin{pmatrix} R' \\ G' \\ B' \end{pmatrix} = \begin{pmatrix} 1.a & 0 & 0 \\ 0 & 1/b & 0 \\ 0 & 0 & 1/c \end{pmatrix} \times \begin{pmatrix} Rn' \\ Gn' \\ Bn' \end{pmatrix} \quad (2)$$

Here, the following are possible examples of basic expressions for calculating S, F2, and F3:

$$S = \min(Rn, Gn, Bn) \quad (1)$$

$$F2(S) = -S \quad (2)$$

$$F3(S) = S \quad (3)$$

Specifically, the minimum RGB (normalized Rn, Gn, and Bn) value is set to S, which is used as it as a W value. For obtaining Rn', Gn', and Bn', S is subtracted from each RGB value.

Here, as the pixel color to be displayed approaches an achromatic color, the ratio at which W dot is caused to emit light increases. Accordingly, as the ratio of colors near to achromatic colors increases in an image to be displayed, the ratio of W dots which emit light also increases and power consumption of the panel is lowered compared to when only RGB dots are used.

As normal images are only rarely constituted by just saturated colors, W dots are used in most cases. Consequently, in RGBW display, the power consumption is on average lower than when only RGB dots are used.

In a panel having RGB dots arranged vertically and horizontally, in order to increase the apparent horizontal resolution, the phase of each input signal is made to correspond to the dot position, as shown in FIG. 5. More specifically, the three dot RGB signals are not input at the same timing, but the sampling timing from each image signal is shifted in accordance with the dot position. This results in a display image having higher apparent resolution than when the three RGB dots forming one pixel are driven by input signals having the same phase.

When RGBW dots are used, it is similarly possible to increase the apparent resolution by making the phase of each input signal correspond to the dot position of the panel as shown in FIG. 6. In the above example using the expressions (1) to (3), however, little effect can be achieved because the emission amount of RGB reduces as the ratio of near achromatic color increases in an image. In particular, when the W primary color is the same as the reference white color, no RGB dots are used for displaying a black-and-white image, which results in the resolution of the image corresponding to the number of W dots, as shown in FIG. 7.

Further, when the following expressions are used for F2 and F3, the usage ratio of W dots varies depending on the value of M.

$$F2(S) = -MS \quad (4)$$

$$F3(S) = MS \quad (5)$$

Here, M is a constant which satisfies $0 \leq M \leq 1$.

In terms of power consumption, it is the most desirable to use M=1. In terms of resolution, however, it is preferable to select the value of M such that all of RGBW emit light.

The present invention advantageously suppresses reduction in the resolution and at the same time reduces power consumption in an OLED display apparatus.

SUMMARY OF THE INVENTION

In accordance with one aspect of the present invention, in an organic light emitting diode (OLED) display apparatus having four types of dots, including R (red), G (green), B (blue), and W (white) dots, formed by an organic light emitting diode (OLED) (or an organic electroluminescence (EL) element), an amount of high frequency components of a part of an image to be displayed is detected, and the usage ratio of W dots is adaptively changed in accordance with the result of detection.

Further, in accordance with another aspect of the present invention, in an OLED display apparatus having four types of dots, including R, G, B, and W dots, formed by an OLED (or an EL element), the average brightness or electric power necessary for display is calculated from input image data, and the usage ratio of W dots is adaptively changed in accordance with the result of calculation.

In accordance with a further aspect of the present invention, in an OLED display apparatus having four types of dots, including R, G, B, and W dots, formed by an OLED (or an EL element), an electric current flowing through an OLED display panel for achieving display in accordance with input image data is detected, and the usage ratio of W dots is adaptively changed in accordance with the detected value.

In accordance with a still further aspect of the present invention, in an OLED display apparatus having four types of dots, including R, G, B, and W dots, formed by an OLED (or an EL element), the usage ratio of W dots is optimized with respect to the resolution in accordance when an input instruction emphasizes image quality and the usage ratio of W dots is increased when an input instruction emphasizes power consumption.

Further, it is preferable that when a battery capacity is reduced, the usage ratio of W dots is increased compared to when the battery capacity is sufficient, for decreasing power consumption.

According to the present invention, by adaptively changing the usage ratio of W dots in accordance with the amount of partial high frequency components of image data, it is possible to reduce power consumption while the resolution is maintained.

Also, by adaptively changing the usage ratio of W dots based on the electric current flowing through the panel, it is possible to prevent large current while proper display is maintained.

In addition, by increasing the usage ratio of W dots when the battery capacity is reduced, it is possible to more effectively utilize the battery capacity.

BRIEF DESCRIPTION OF THE DRAWINGS

A preferred embodiment of the present invention will be described in detail based on the following drawing, wherein.

DETAILED DESCRIPTION OF PREFERRED EMBODIMENT

A preferred embodiment of the present invention will be described in further detail with reference to the drawings.

Figure 8:
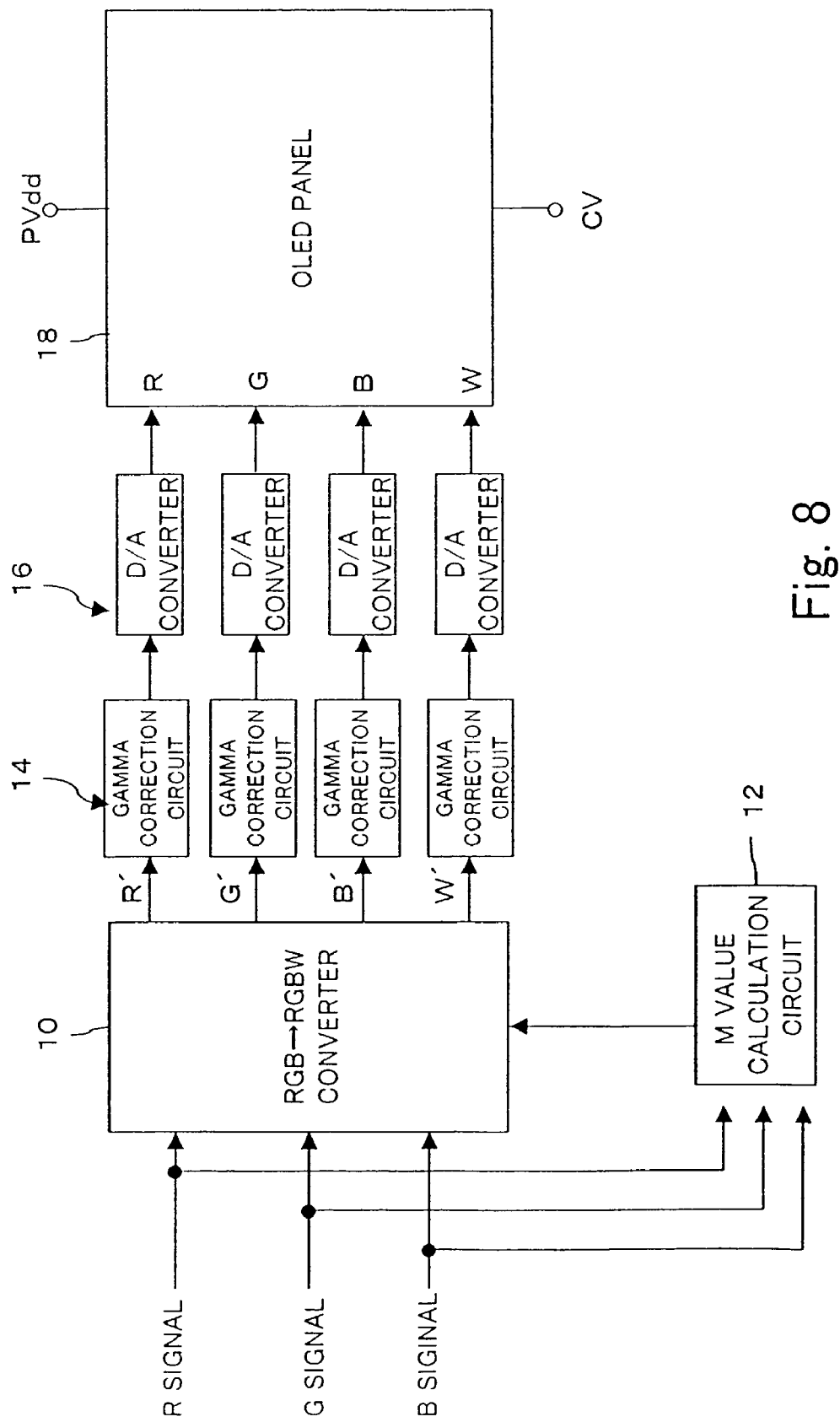
FIG. 8 is a block diagram showing a structure of a display apparatus considering partial high frequency components of an input image signal.

FIG. 8 is a block diagram showing a structure according to one embodiment of the present invention. An R signal, a G signal, and a B signal are input to an RGB to RGBW conversion circuit 10, and are also supplied to an M value calculation circuit 12. The M value calculation circuit 12 detects, in real time, high frequency components from an image signal of the input RGB signals for a predetermined plural number of pixels (portion) and calculates a conversion coefficient M to be used for conversion from RGB to RGBW in accordance with the detected amount of the high frequency components. More specifically, the M value calculation circuit 12 outputs a coefficient M (0.5, for example) with which all the RGBW dots emit light for edge portions or portions with significant change in brightness in an image, and outputs M whose value is 1 or close to 1 for flat portions or portions with slight change in brightness in an image.

The calculated M is then supplied to the RGB to RGBW conversion circuit 10. The RGB to RGBW conversion circuit 10 uses the conversion coefficient M to calculate F2(S) and F3(S), and further computes RGBW signals using F2(S) and F3(S).

R', G', B' and W signals output from the RGB to RGBW conversion circuit 10 are subjected to gamma correction in corresponding gamma correction circuits 14 before being converted to analog signals by corresponding D/A converters 16, and the analog signals are supplied to an OLED panel 18. The OLED panel 18 includes a horizontal driver and a vertical driver, and supplies a data signal concerning each pixel to be input to each of the OLED elements (also referred to as electroluminescence (EL) elements) arranged in a matrix in a pixel circuit. More specifically, the OLED panel 18 of the present embodiment is an active matrix type panel, in which each pixel circuit includes a selection transistor, a driving transistor, a storage capacitor, and an OLED element. The data signal of each pixel is written, via the selection transistor of a corresponding pixel, into the storage capacitor. When a driving current in accordance with the data voltage written into the storage capacitor is supplied from the driving transistor to the OLED element, the OLED element emits light.

It is also preferable to perform data processing for adjusting the black level, contrast, and brightness in the gamma correction circuit 14. Further, it is possible that the D/A converters 16 are omitted and the digital data are input to the OLED panel 18 for digitally driving each pixel circuit in the OLED panel 18.

Figure 9:
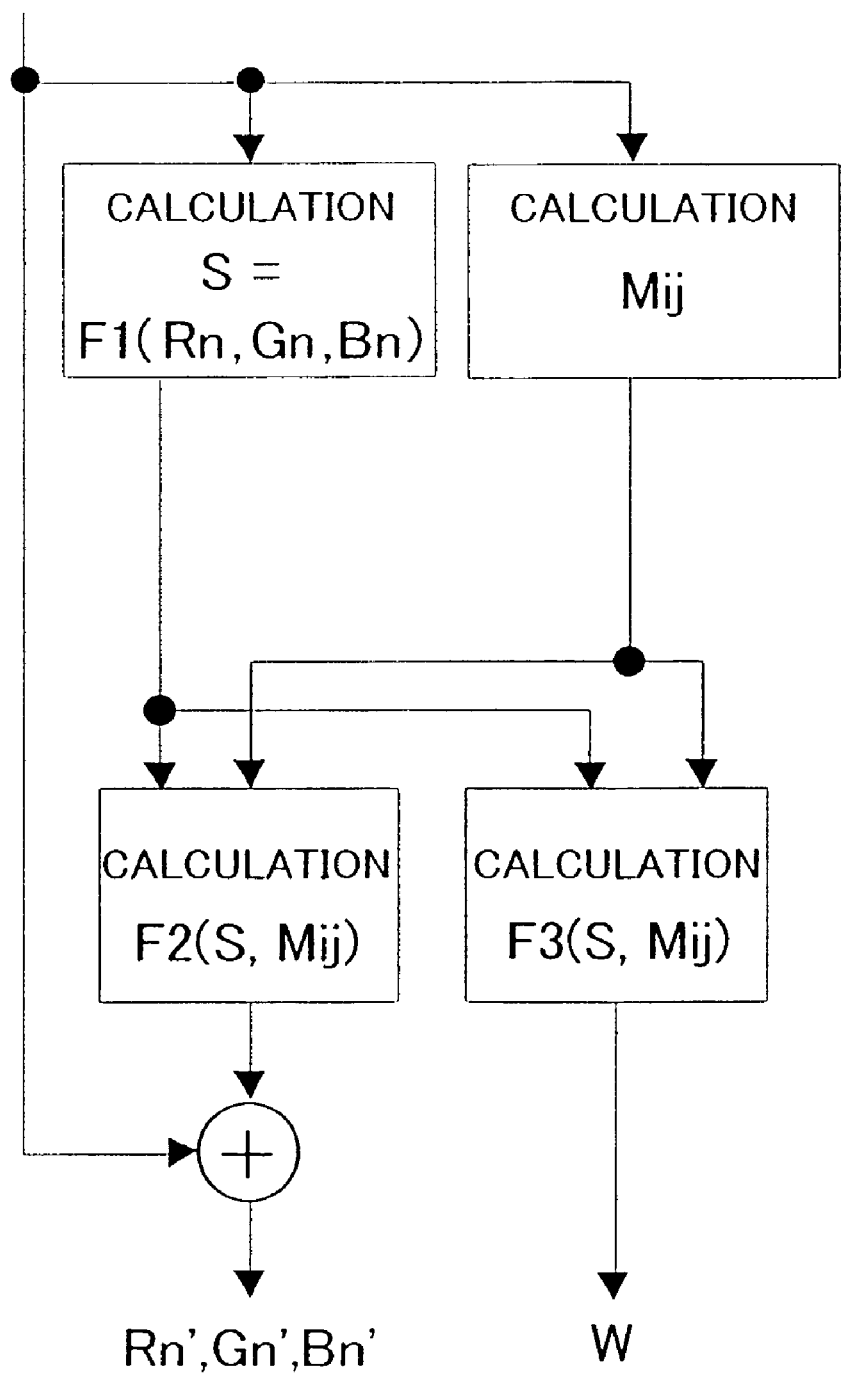
FIG. 9 is a flowchart showing a process for generating Rn', Gn', and Bn' from Rn, Gn, and Bn.

Here, the conversion from RGB to RGBW will be described with reference to the flowchart of FIG. 9. Specifically, the RGB to RGBW conversion circuit 10 calculates S=F1(Rn, Gn, Bn) based on the RGB input signals (which have been converted to Rn, Gn, and Bn in this example). On the other hand, the M value calculation circuit 12 detects an amount of high frequency components at the portion of a target pixel (which is located at the i-th in the horizontal direction and at the j-th in the vertical direction) from a predetermined number of pixel blocks arranged in the horizontal and vertical directions, calculates a coefficient Mij in accordance with the detected amount of high frequency components, and supplies the coefficient Mij to the RGB to RGBW conversion circuit 10.

The RGB to RGBW conversion circuit 10, using the supplied coefficient Mij, calculates F2(S, Mij) and F3(S, Mij), F3(S, Mij) being output as it is as a W value and F2(S, Mij) being added to Rn, Gn, and Bn, respectively and output as Rn', Gn', and Bn'.

In the above manner, RGB is converted into RGBW.

Here, as a predetermined number of image data items are necessary for calculation of Mij, it is necessary to store an amount of input data. For example, it is possible to provide a frame memory for the input RGB signals and supply necessary data from this frame memory.

Further, Mij can be expressed by the following expression.

$$Mij = f\left(\left|\frac{\sum_{k1=-\infty}^{\infty}\sum_{k2=-\infty}^{\infty} h(k1,k2)C(i-k1, j-k2)}{\sum_{k1=-\infty}^{\infty}\sum_{k2=-\infty}^{\infty} l(k1,k2)C(i-k1, j-k2)}\right|\right) \quad (6)$$

Figure 10:
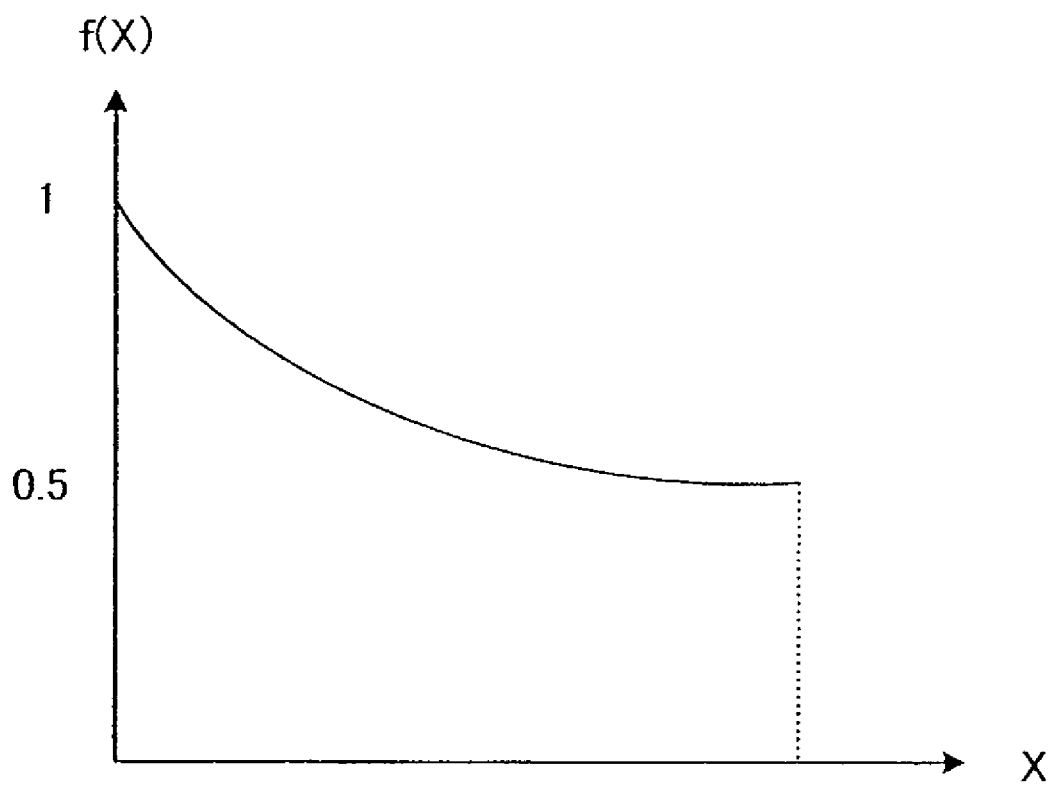
FIG. 10 is a view showing the characteristics of the function f(X) used for generating Mij.

Here, (i,j) represents a spatial position of a dot to be processed (i.e., the i-th in the horizontal direction and the j-th in the vertical direction); h(k1, k2) represents response characteristics of a two-dimensional high pass filter with respect to the unit impulse δ(k1, k2); l(k1, k2) represents response characteristics of a two-dimensional low pass filter with respect to the unit impulse δ(k1, k2); and C(i-k1, j-k2) represents a signal level corresponding to a dot at the position (i-k1, j-k2). Further, f(X) is an arbitrary function which has characteristics of approaching 0.5 from 1 with the increase of X, as shown in FIG. 10, for example.

While the signals Rn, Gn, Bn, the brightness (Y), or the like may be arbitrarily selected as the signal C, it is preferable to use brightness components which contribute to the resolution. The following are representative example expressions for F2 and F3:

$$F2=-Mij \times S \quad (7)$$

$$F3=Mij \times S \quad (8)$$

Figure 1:
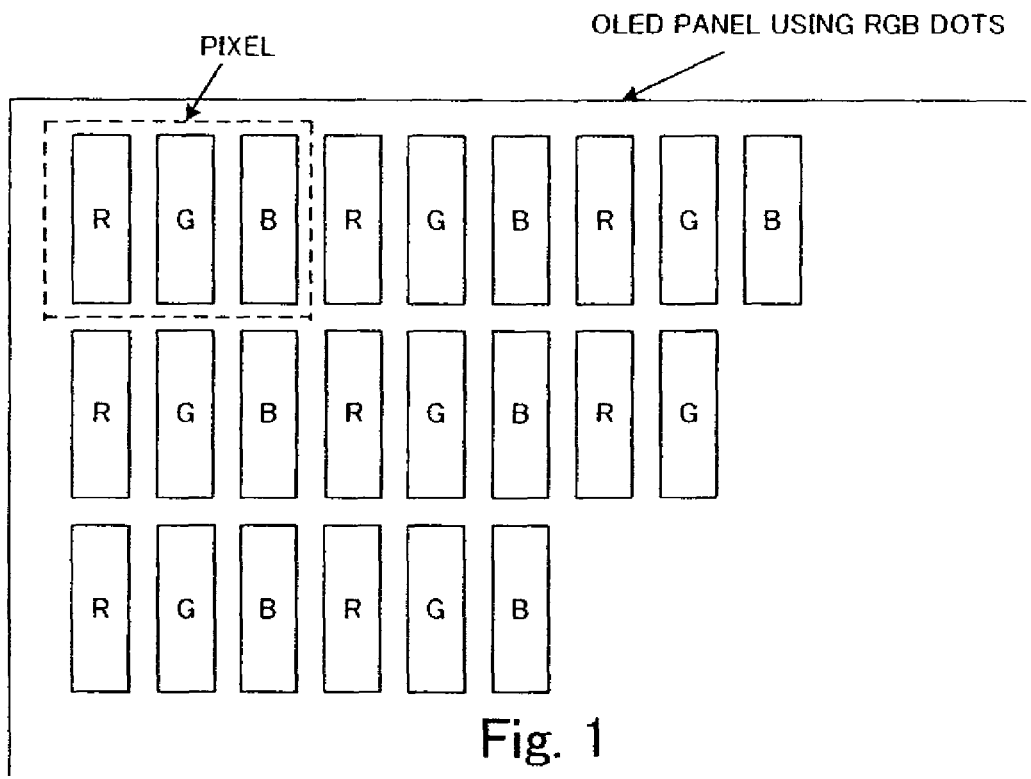
FIG. 1 is a view showing an OLED panel using RGB dots.
Figure 2:
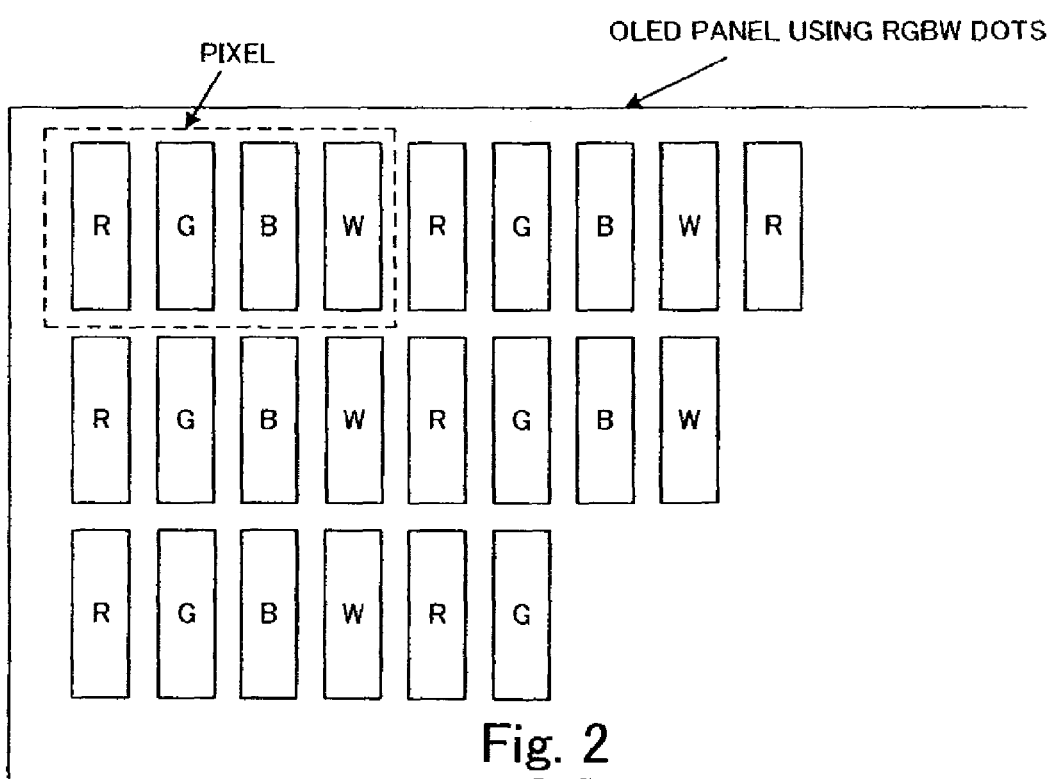
FIG. 2 is a view showing an OLED panel using RGBW dots.
Figure 3:
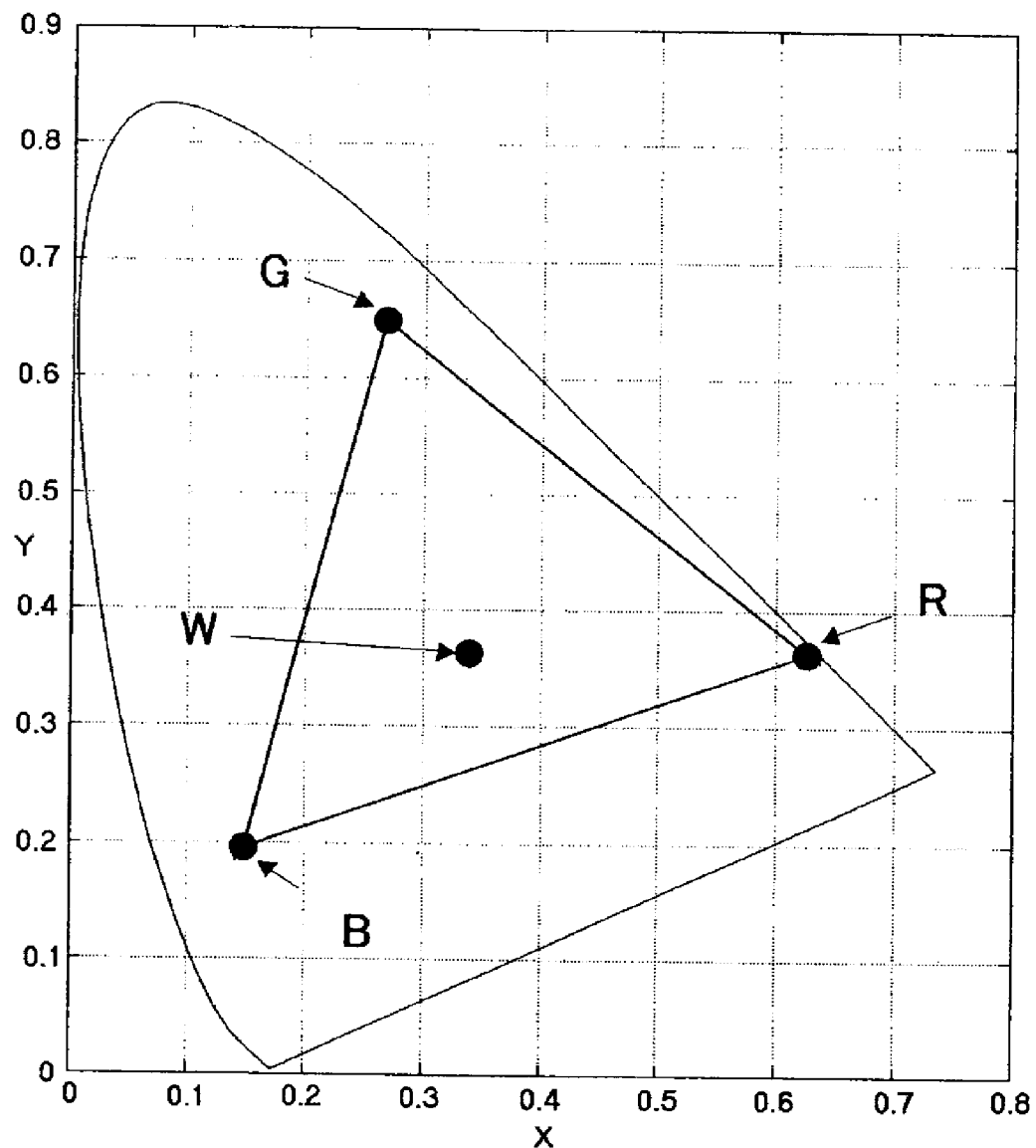
FIG. 3 is a view showing RGBW in a CIE1931 chromaticity diagram.
Figure 4:
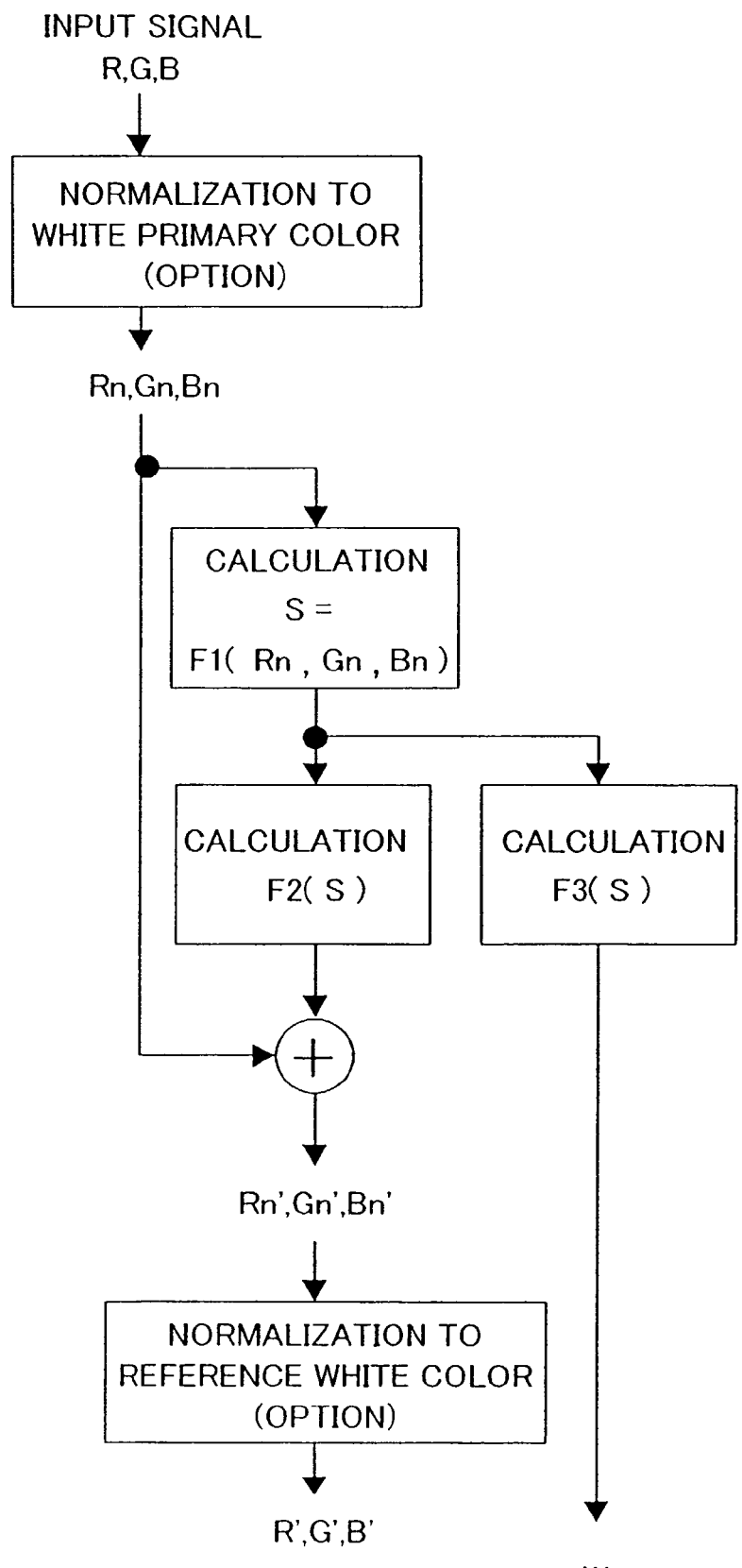
FIG. 4 is a flowchart showing a process for generating RGBW from RGB.
Figure 5:
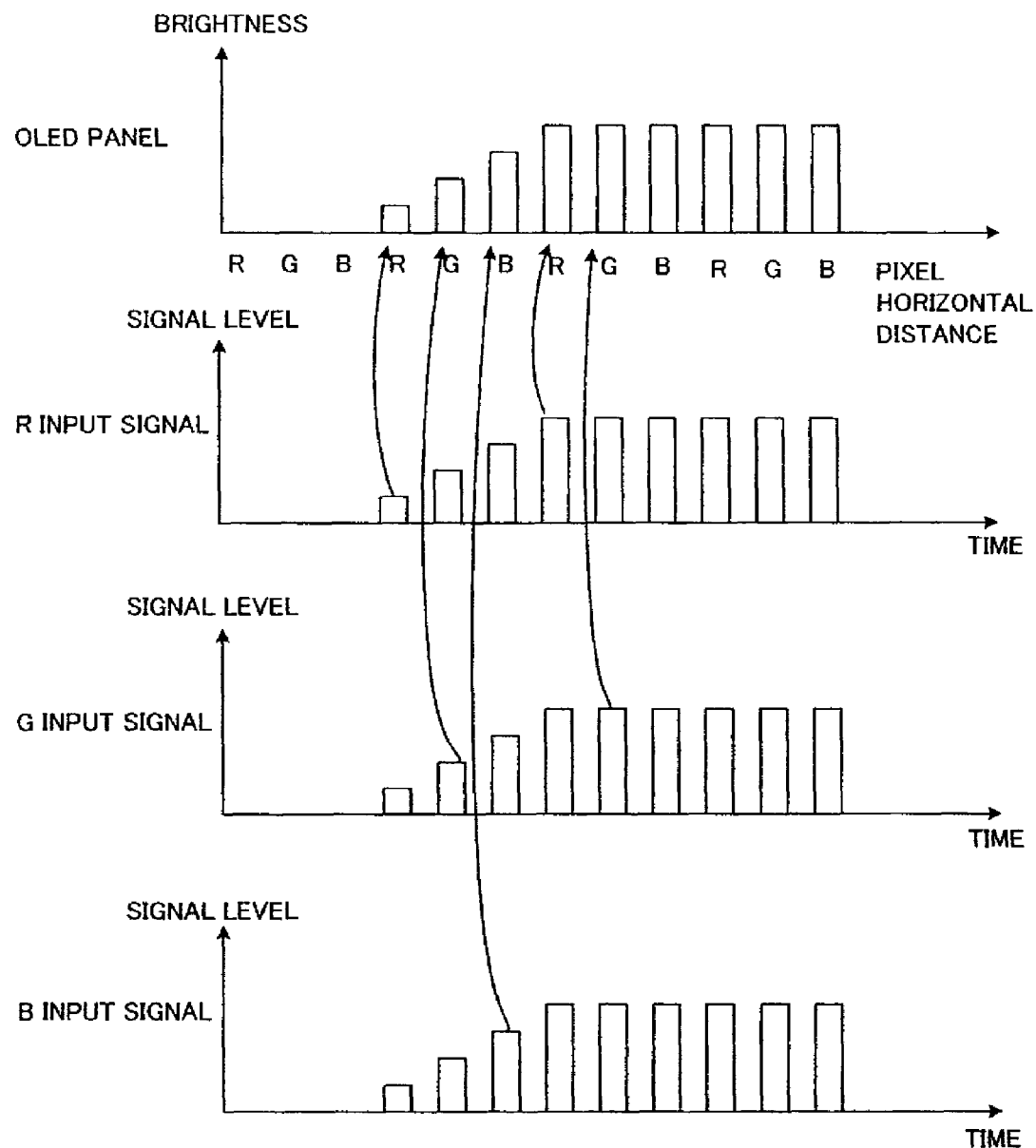
FIG. 5 is a view showing display timing of RGB dots.
Figure 6:
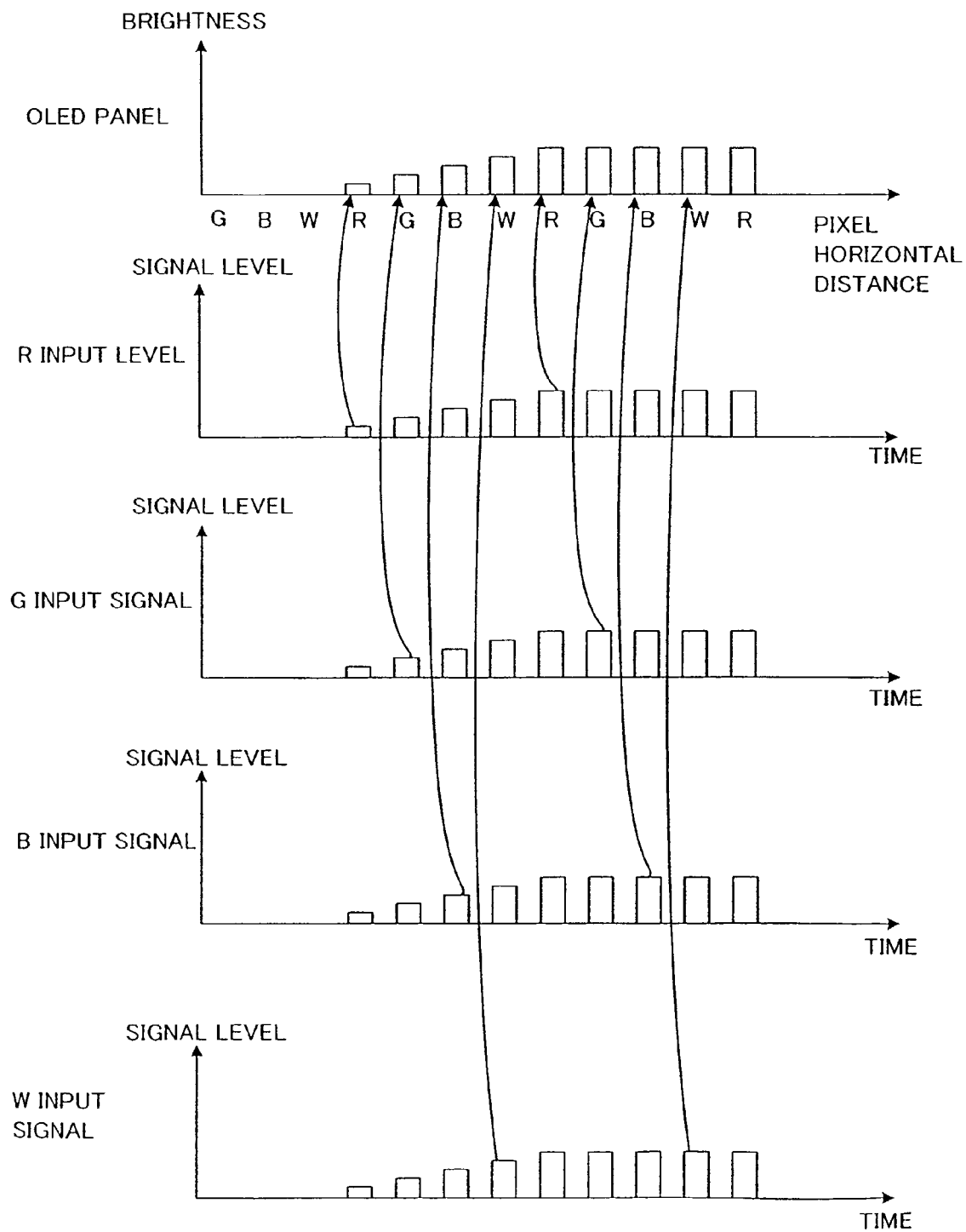
FIG. 6 is a view showing display timing of RGBW dots.
Figure 7:
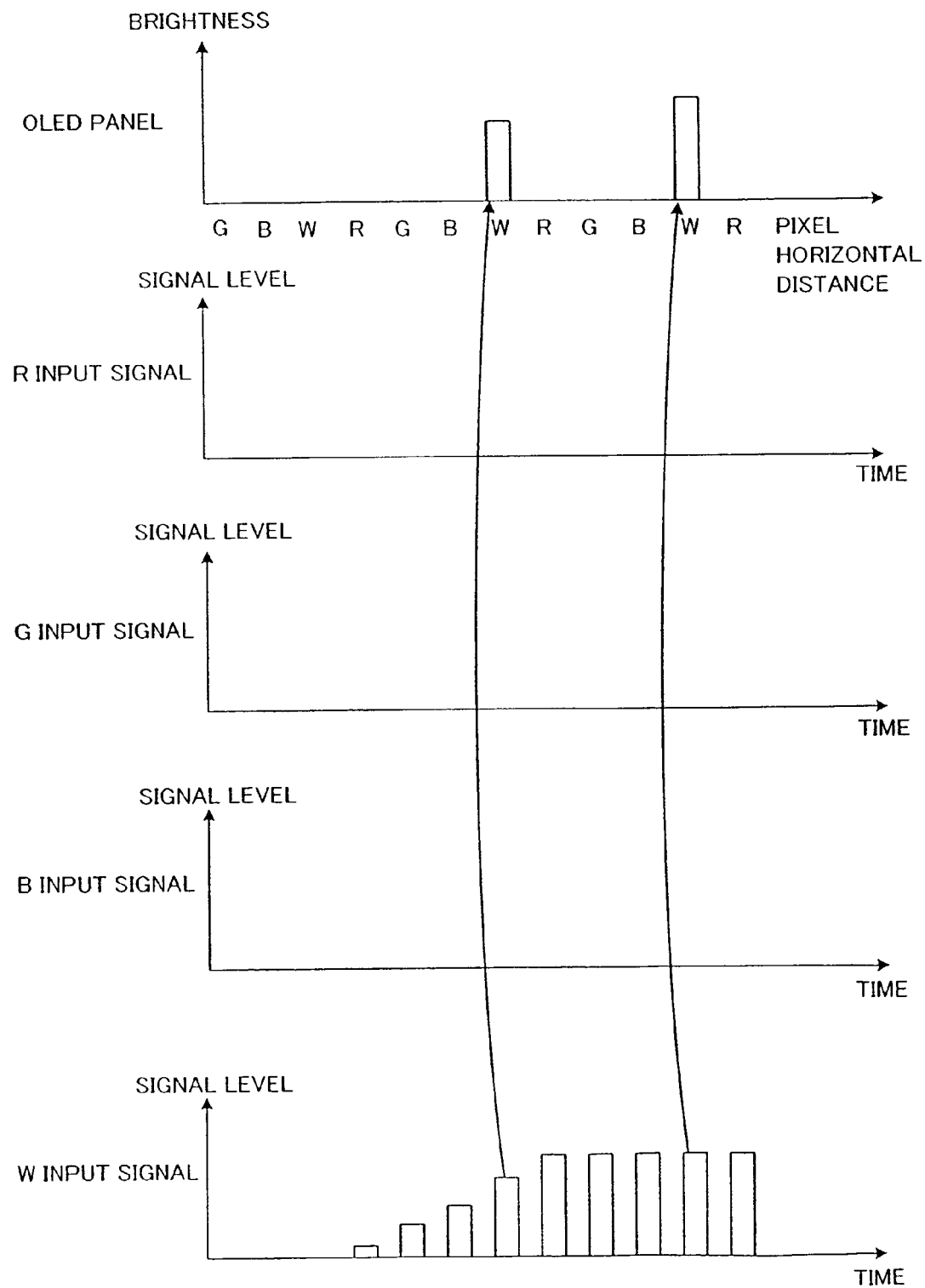
FIG. 7 is a view showing timing of inputting only W signals in an RGBW dot panel.

When dots are arranged in stripes extending in the vertical direction as shown in FIG. 2, a one-dimensional high pass filter and a one-dimensional low pass filter may be provided, considering only the resolution in the horizontal direction. In this case, the above expressions (6) to (8) are changed as follows:

$$Mi = f\left(\left|\frac{\sum_{k=-\infty}^{\infty} h(k)C(i-k)}{\sum_{k=-\infty}^{\infty} l(k)C(i-k)}\right|\right) \quad (9)$$

$$F2 = -Mi \times S \quad (10)$$

$$F3 = Mi \times S \quad (11)$$

EXAMPLES

The conversion process as described above will be described with reference to specific examples.

First Example

Here, assuming that dots are arranged in stripes in the vertical direction, the above expressions (9) to (11) are used. The following expressions are used for h(k) and l(k), and Mi is set such that it is not over 1.

h(k): $h(-1)=-\frac{1}{2}$, $h(0)=1$, $h(1)=-\frac{1}{2}$, $h(k)=0$ when k>1 or k<-1.

l(k): $l(-1)=1$, $l(0)=2$, $l(1)=1$, $h(1)=0$ when k>1 or k<-1.

When brightness Yi at the position i is used for signal C, the expression (9) can be expressed as follows:

$$Mi=f(|(-Y_{i-1}+2Y_i-Y_{i+1})/2(Y_{i-1}+2Y_i+Y_{i+1})|)$$

Assuming that f(X)=1-X, the above expression is expressed as $$Mi=1-|(-Y_{i-1}+2Y_i-Y_{i+1})/2(Y_{i-1}+2Y_i+Y_{i+1})|.$$

Accordingly, Mi is a variable which always satisfies $0 \leq Mi \leq 1$. (However, Mi=1 when $Y_{i-1}+2Y_i+Y_{i+1}=0$)

As described above, according to the above example, it is possible to adaptively change the coefficient M in accordance with the amount of partial high frequency components. It is therefore possible to comparatively reduce the usage ratio of W dots in edge portions or the like for achieving clear display. On the other hand, it is possible to increase the usage ratio of W dots in the portions with less change in the image for achieving effective display.

Second Example

As described above, the coefficient M is calculated in the M value calculation circuit 12. However, there are cases in which the calculated coefficient M(Mij) varies too much among dots. Accordingly, by inserting a low pass filter after the calculation output Mij from the M value calculation circuit 12, it is possible to preferably prevent the usage ratio of W dots from excessively varying for each dot and causing unnatural image.

In addition, it is also preferable to set $$F2=-Ai \times S$$

$$F3=Ai \times S$$

In the above expressions, Ai is a predetermined coefficient (A1, A2, A3, . . . An) and is selected in accordance with the value of Mi (or Mij). With the use of such a coefficient Ai, redundancy is increased compared to when the coefficient M is used, and RGB to RGBW conversion considering the viewability of actual display can be performed. Further, by rewriting the table of the coefficient Ai, the conversion characteristics can be adjusted simply. It is therefore preferable to use a rewritable table for Ai.

Further, in the above example, a simple filter as described below can be used.

h(k): $h(-1)=-1, h(0)=1, h(k)=0$ when $k<-1$ l(k): m

Here, m is a constant selected such that it always satisfies $0 \leq Mi \leq 1$. With this structure, a filter structure can be simplified and adaptive control in accordance with input image data can be secured.

Third Example

As described above, the electric current flowing in each dot of an OLED panel is proportional to brightness of the corresponding dot, and power consumption for the whole image corresponds to the total sum of the electric current. Accordingly, the higher the average brightness of an image, the greater the power consumption of the panel. When the maximum power source current of a display device is limited, for example, M having a great value can be used so as to increase the usage ratio of W, in addition to the increase of the average brightness.

Figure 11:
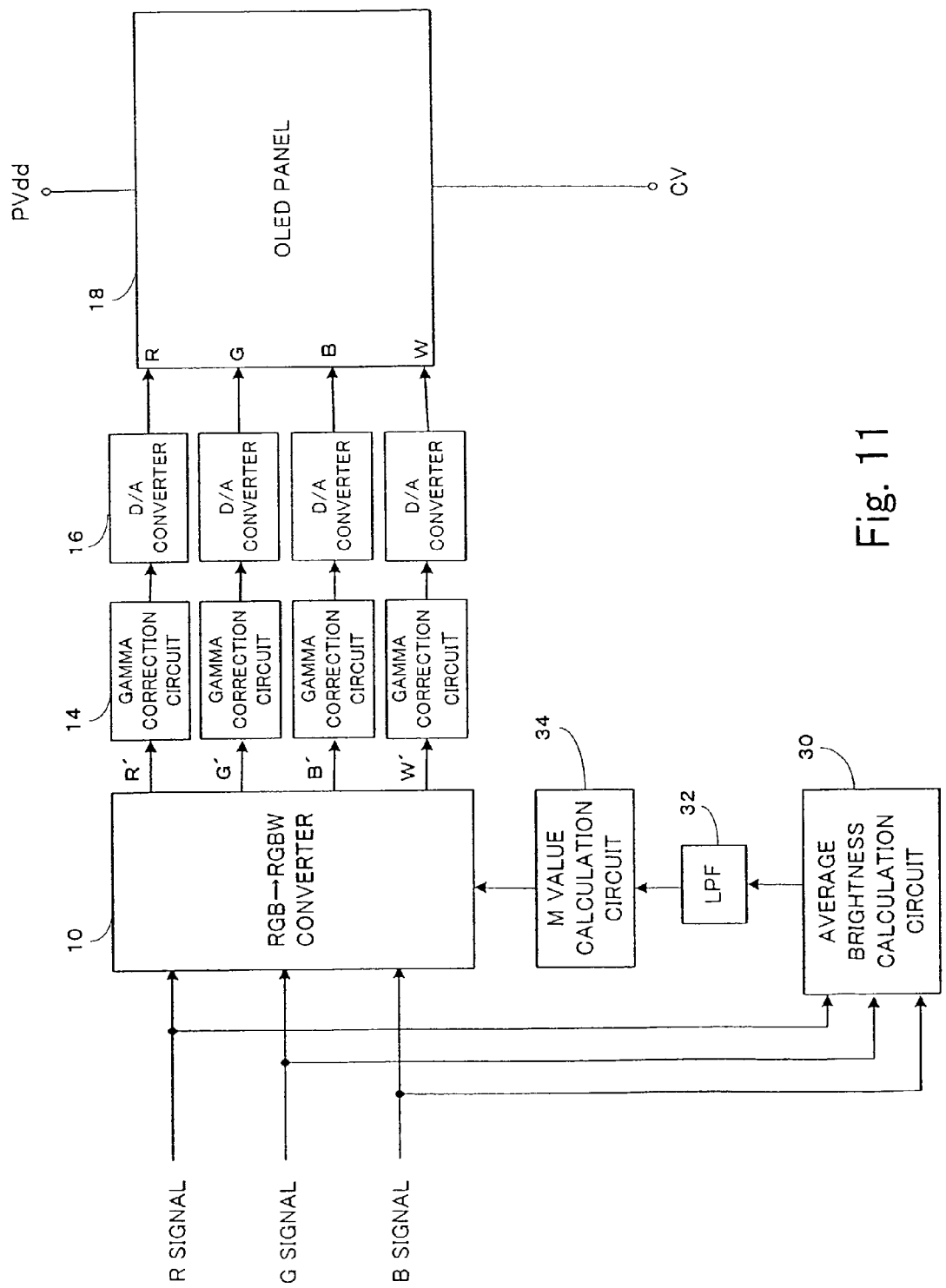
FIG. 11 is a block diagram showing a structure of a display apparatus when considering the average brightness.

An example which considers the average brightness as described above is shown in FIG. 11. In this example, RGB input signals are supplied to an average brightness calculation section 30, which calculates the average brightness (or the sum) from data of the RGB input signals corresponding to one screen. The resultant average brightness is supplied to the low pass filter (LPF) 32 so as to remove a rapid change component and then supplied to the M value calculation circuit 34. The M value calculation circuit 34 has stored therein tables and expressions concerning M values corresponding to the average brightness, computes an M value for the input average brightness, and supplies the M value to the RGB to RGBW conversion circuit 10.

Figure 12:
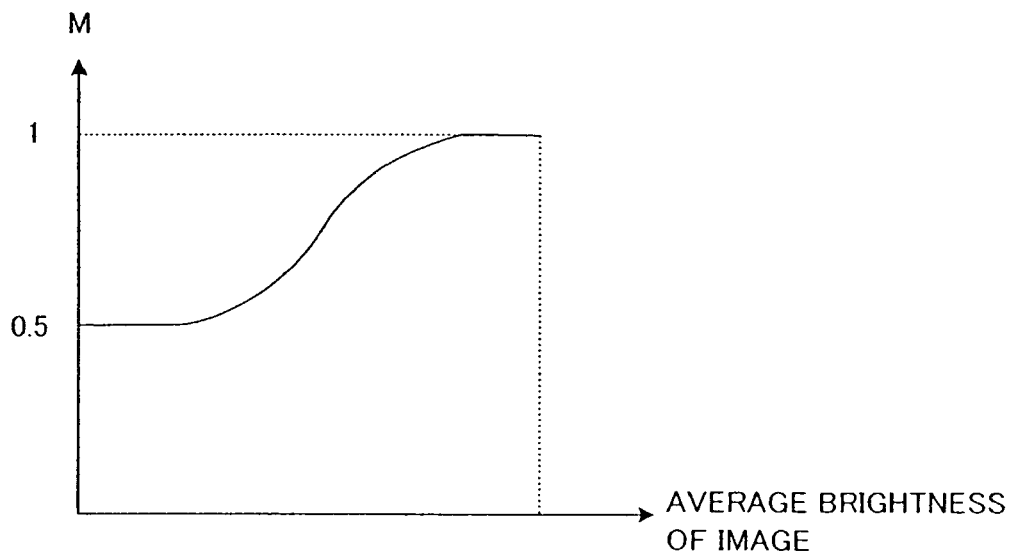
FIG. 12 is a view showing a relationship between the average brightness and the coefficient M in the structure shown in FIG. 11.
Figure 13:
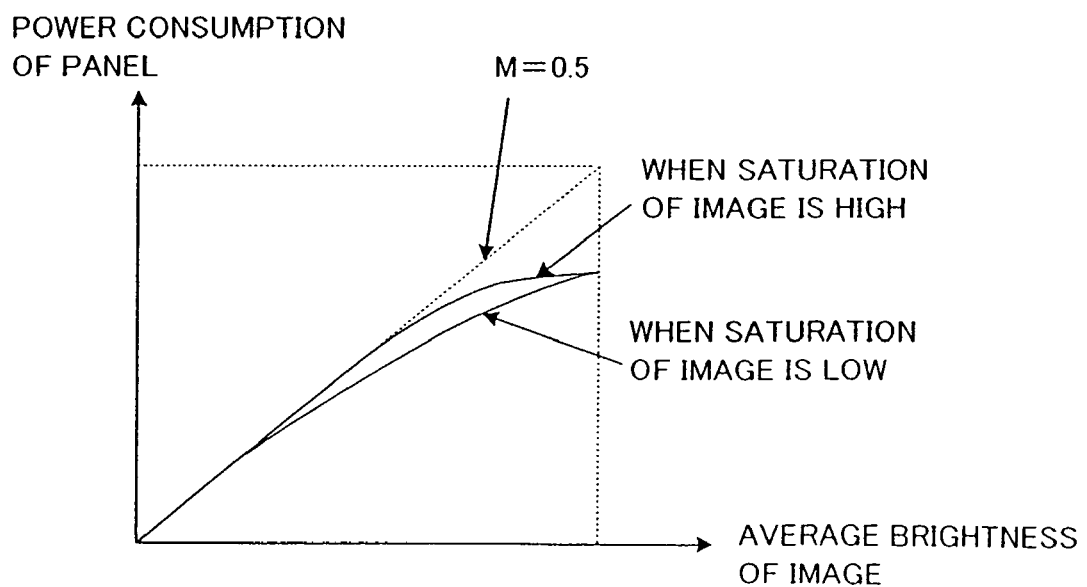
FIG. 13 is a view showing a relationship between the average brightness of a certain image and the panel power consumption in the structure shown in FIG. 11.

A setting example of the characteristics of M with respect to average brightness is shown in FIG. 12. As shown, with the increase of brightness, M is gradually increased from 0.5. FIG. 13 exemplifies power consumption versus average brightness in a certain image when such a setting is used. As shown in FIG. 13, with this setting, it is possible to suppress increase in the amount of current consumed in the panel when the average brightness of the image is high, compared to when M is fixed to 0.5 (M=0.5).

Figure 14:
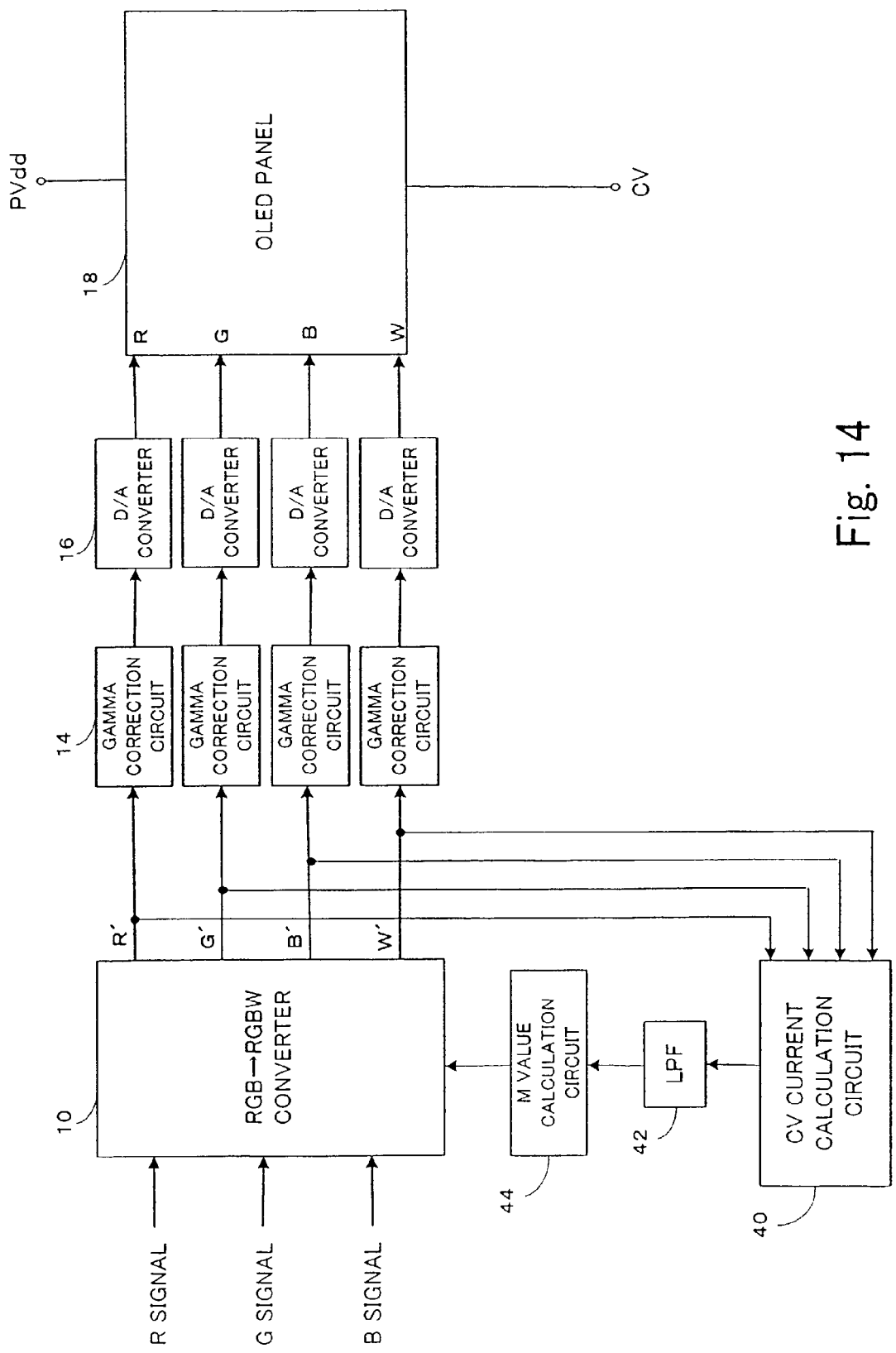
FIG. 14 is a block diagram showing a structure of a display apparatus considering the result of calculation of CV current.

Further, as shown in FIG. 14, it is also possible to estimate a CV current from the converted RGBW data considering emission efficiency of RGBW dots and use the estimated CV current for calculation of the M value. More specifically, each output of RGBW from the RGB to RGBW conversion circuit 10 is supplied to a CV current calculation section 40. The CV current calculation section 40 estimates an electric current (CV current) for all the pixels in the OLED panel 18 in accordance with each data signal of RGBW. The resultant estimated CV current is then supplied to the M value calculation circuit 44 via the low pass filter (LPF) 42. The M value calculation circuit 44 calculates M corresponding to the CV current and supplies the result to the RGB to RGBW conversion circuit 10.

Figure 15:
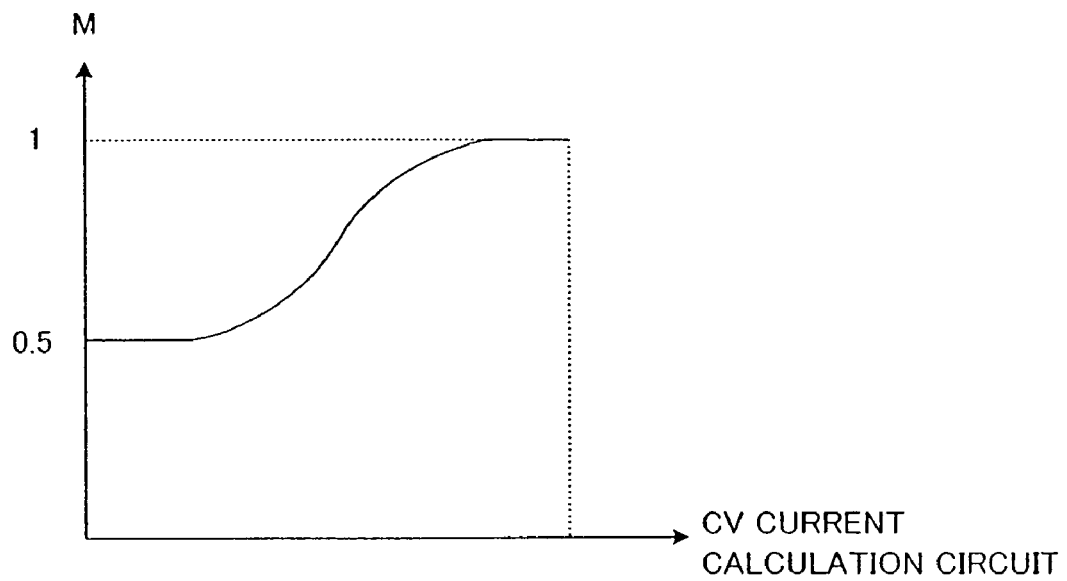
FIG. 15 a view showing a relationship between the average brightness and the coefficient M in the structure shown in FIG. 14.
Figure 16:
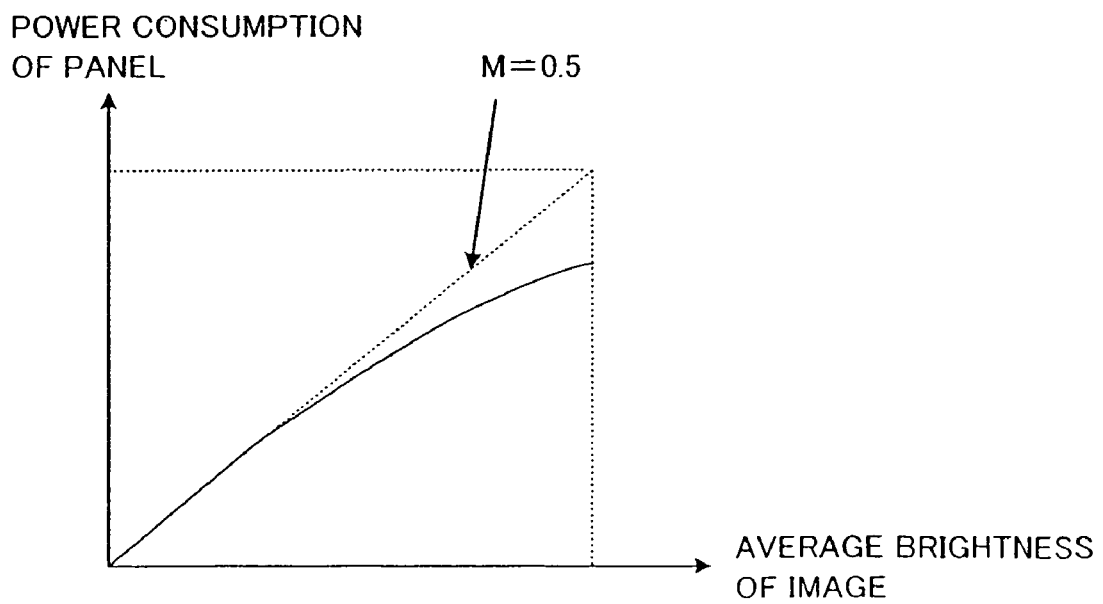
FIG. 16 is a view showing a relationship between the average brightness of a certain image and the panel power consumption in the structure shown in FIG. 14.

With regard to this example, FIG. 15 shows an example setting of characteristics of M with respect to the CV current calculation value and FIG. 16 exemplifies a relationship between the average brightness and the power consumption of a panel in a certain image. With this structure, it is also possible to effectively suppress an increase in panel current.

Figure 17:
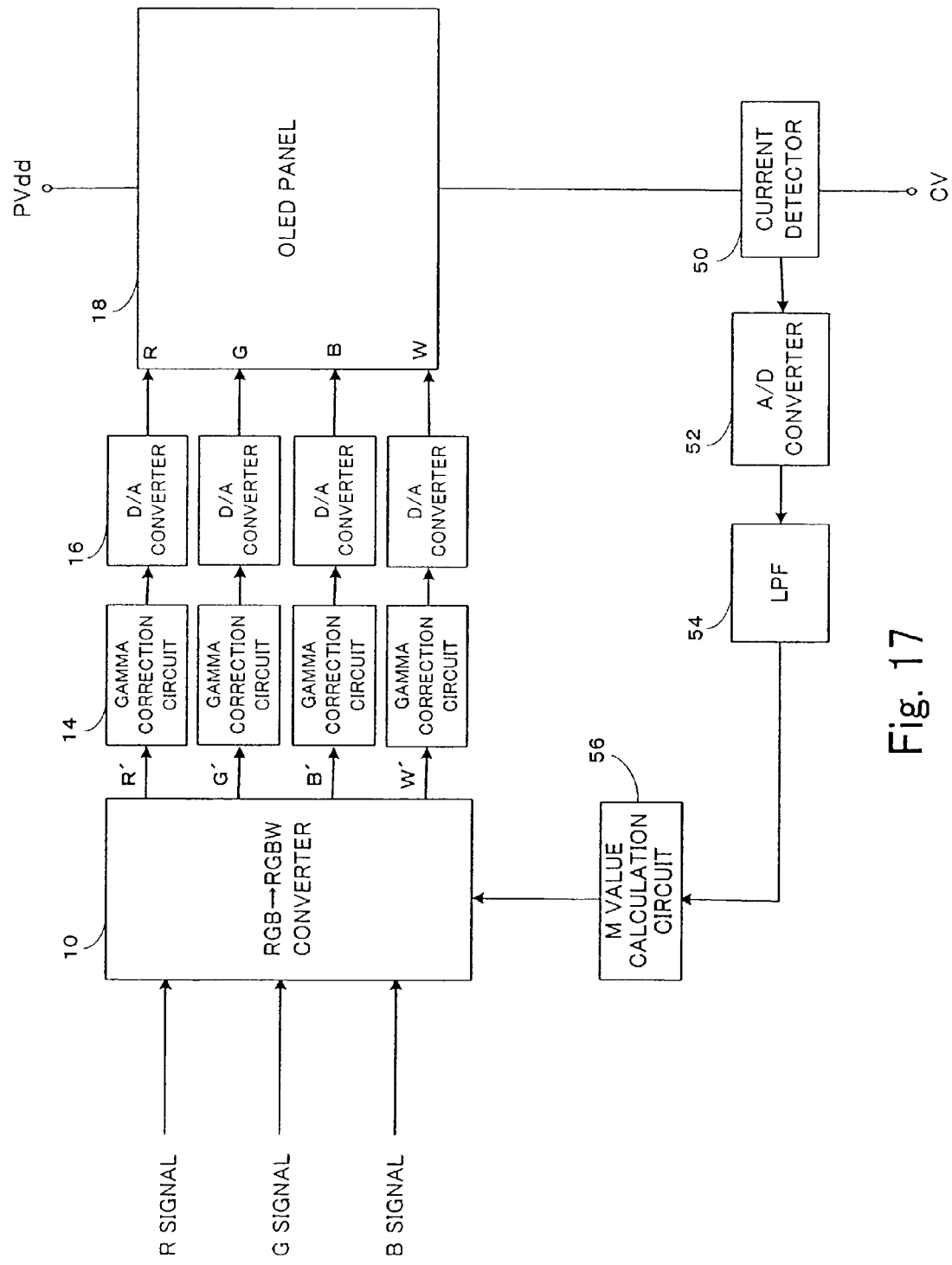
FIG. 17 is a block diagram showing a structure of a display apparatus considering the result of detection of CV current.

A similar effect can also be achieved by measuring the CV current of the OLED panel 18 and applying feedback to the M value. An example structure in this case is shown in FIG. 17. Specifically, the CV current is detected by a current detection circuit 50, and the output of the current detection circuit 50 is converted to digital data by an A/D converter 52 and is supplied to an M value calculation circuit 56 via a low pass filter 54. With such a circuit, control similar to that performed by the above structure can be achieved.

Figure 18:
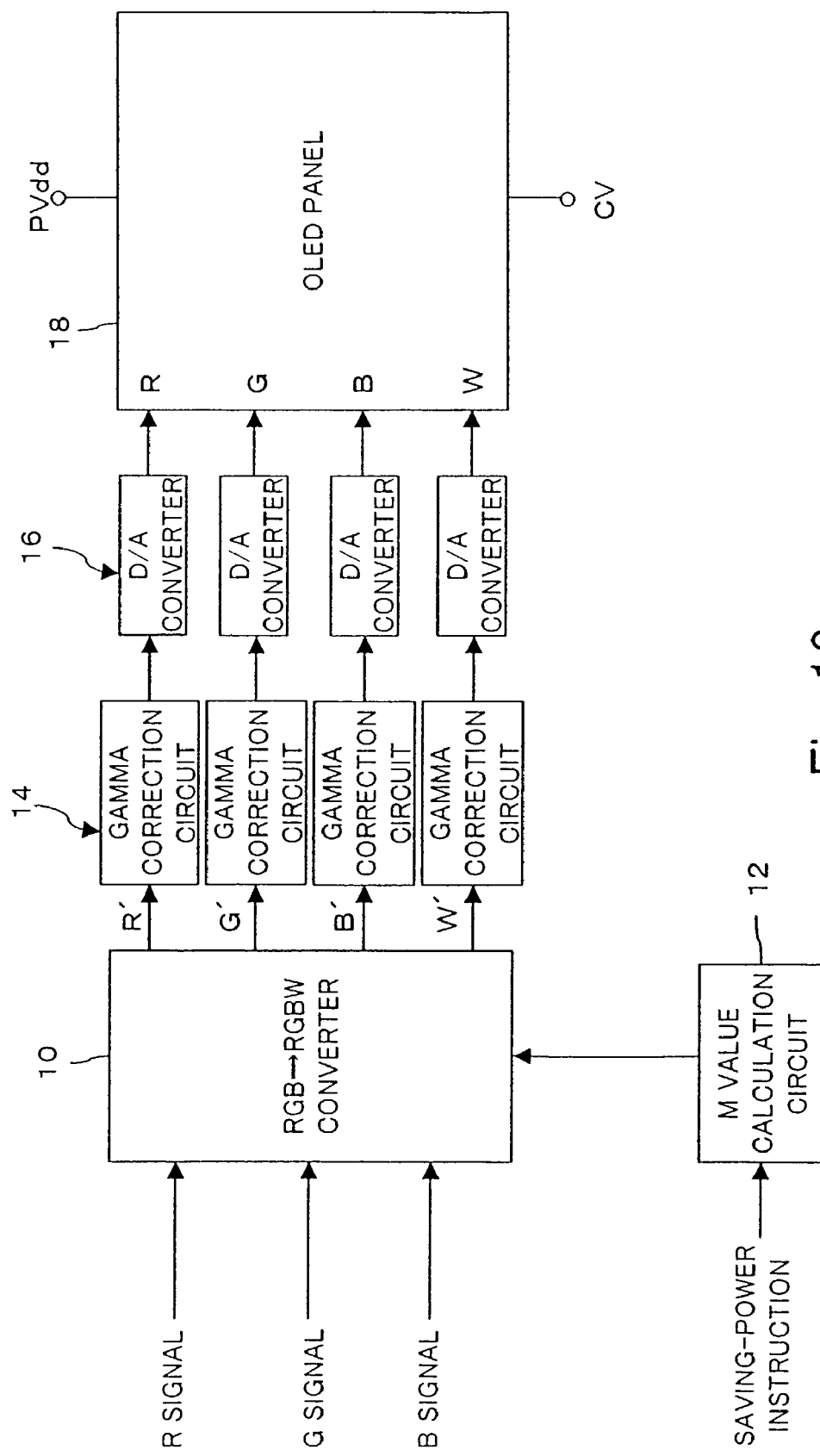
FIG. 18 is a block diagram showing a structure of a display apparatus considering a saving power instruction.

Further, to simplify control can be performed in the following manner, rather than based on the content of an image. Specifically, when the image quality is to be emphasized, M is selected such that the apparent resolution is the highest, whereas when the power consumption is to be emphasized, M is switched to a greater value so as to increase the usage ratio of W dots. For example, it is possible that an input means (an input button, for example) concerning saving-power display is provided, and when this button is pressed on, a saving-power instruction signal instructs the M value calculation circuit 12 to increase the value of M. The structure for achieving this control is shown in FIG. 18.

Also, in portable devices such as OLED display devices, such as, for example, cellular phones, digital still cameras, portable AV equipment, and the like, there is a demand that power consumption be reduced when the battery capacity becomes low.

Figure 19:
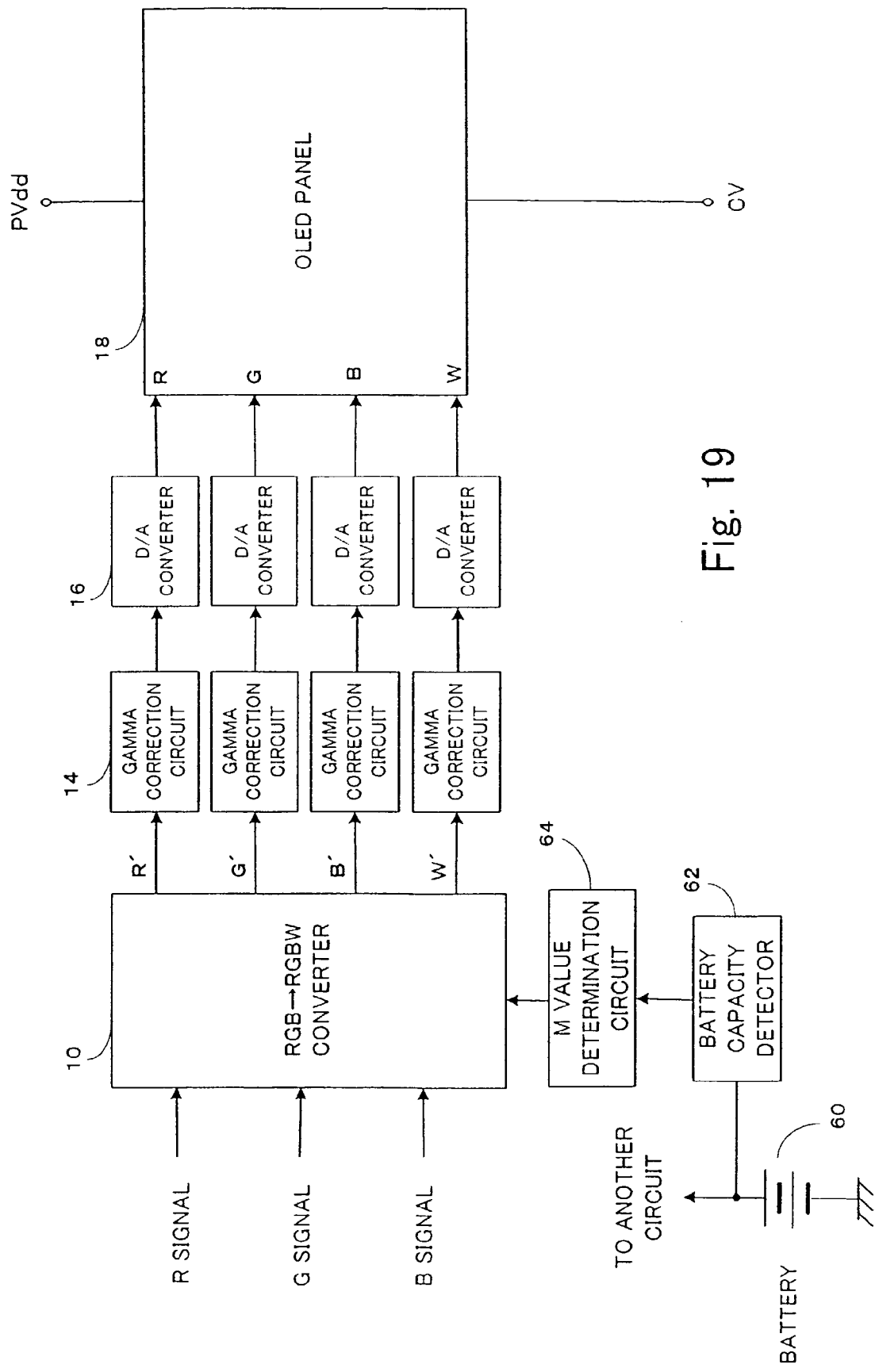
FIG. 19 is a block diagram showing a structure of a display apparatus considering the result of detection of battery capacity.

A structure example which meets the above demand is shown in FIG. 19. Specifically, the capacity (a voltage, for example) of a battery 60 is detected by a battery capacity detection circuit 62. When the detection result from the battery capacity detection circuit 62 indicates that the battery capacity is less than a predetermined value, an M value determination circuit 64 changes the M value to a greater value. This structure allows control to make the M value greater when the battery capacity is small than when the battery capacity is sufficient, so that power consumption can be reduced in low power situations. It is further preferable that, the battery capacity be determined in a plurality of increments so as to increase the M value in the plurality of steps.

It is also preferable that the above structures be combined as necessary to constitute a display apparatus.

While the preferred embodiment of the present invention is described above using specific terms, such description is for illustrative purposes only, and it is to be understood that changes and variations may be made without departing from the spirit or scope of the appended claims.

PARTS LIST 10 conversion circuit
12 calculation circuit
14 correction circuit
16 D/A converters
18 OLED panel
30 calculation section
32 low pass filter (LPF)
34 calculation circuit
40 calculation section
42 low pass filter (LPF)
44 calculation circuit
50 current detection circuit 52 A/D converter
54 low pass filter
56 calculation circuit
60 battery
62 detection circuit
64 determination circuit

The invention claimed is:

1. An organic light emitting diode (OLED) display apparatus, comprising:
 (a) means for detecting the amount of high frequency components of a target pixel of a color image to be displayed, wherein the color image includes an input RGB signal for each of a plurality of pixels;
 (b) means for calculating a respective conversion coefficient between 0 and 1 for the target pixel in accordance with the result of the detection and the spatial position of the pixel;
 (c) means for converting the input RGB signals for the target pixel to RGBW signals for that pixel using the respective conversion coefficient; and
 (d) a plurality of pixels each having a R (red), a G (green), a B (blue), and a W (white) dot for producing light in response to the corresponding RGBW signals, so that when the conversion coefficient for a pixel is less than 1, the R, G, B and W dots in the pixel all emit light simultaneously,
 wherein the conversion coefficient determines a usage ratio of the W dot.

2. The OLED display apparatus of claim 1, further including a battery and a battery capacity detection circuit;
 wherein the conversion coefficients are increased when the battery capacity detection circuit indicates that the battery capacity is less than a predetermined value.

3. An organic light emitting diode (OLED) display apparatus, comprising:
 (a) means for calculating the average brightness or electric power necessary for display of a color image from input image data of one screen, wherein the color image includes an input RGB signal for each of a plurality of pixels;
 (b) means for calculating a respective conversion coefficient between 0 and 1 for each pixel in accordance with the result of such calculation;
 (c) means for converting the input RGB signals for each pixel to RGBW signals for that pixel using the respective conversion coefficient; and
 (d) a plurality of pixels, each having a R (red), a G (green), a B (blue), and a W (white) dot for producing light in response to the corresponding RGBW signals, so that when the conversion coefficient for a pixel is less than 1, the R, G, B and W dots in the pixel all emit light simultaneously.

4. The organic light emitting diode (OLED) display apparatus of claim 3, wherein the conversion coefficient is calculated to adaptively change the usage ratio of the W dots depending on the spatial position of the W dot.

5. An organic light emitting diode (OLED) display apparatus, comprising:
 (a) a current detection circuit for detecting an electric current flowing through the OLED for achieving display in accordance with input image data, wherein the color image includes an input RGB signal for each of a plurality of pixels;
 (b) means for calculating a respective conversion coefficient between 0 and 1 for each pixel in accordance with the detected electric current and the spatial position of the pixel;
 (c) means for converting the input RGB signals for each pixel to RGBW signals for that pixel using the respective conversion coefficient; and
 (d) a plurality of pixels each having a R (red), a G (green), a B (blue), and a W (white) dot for producing light in response to the corresponding RGBW signals, so that when the conversion coefficient for a pixel is less than 1, the R, G, B and W dots in the pixel all emit light simultaneously,
 wherein the conversion coefficient determines a usage ratio of the W dot.

6. An organic light emitting diode (OLED) display apparatus, comprising:
 (a) a calculation circuit to detect the amount of high frequency components of a target pixel of a color image to be displayed, wherein the color image includes an input RGB signal for each of a plurality of pixels, and to calculate a respective conversion coefficient between 0 and 1 for each pixel in accordance with the result of the detection and the spatial position of the pixel;
 (b) a conversion circuit connected to the calculation circuit to receive the respective conversion coefficient and to convert the input RGB signals for each pixel to RGBW signals for that pixel using the respective conversion coefficient; and
 (c) a plurality of pixels each having a R (red), a G (green), a B (blue), and a W (white) dot to produce light in response to the corresponding RGBW signals, so that when the conversion coefficient for a pixel is less than 1, the R, G, B and W dots in the pixel all emit light simultaneously,
 wherein the conversion coefficient determines a usage ratio of the W dot.

7. The organic OLED display apparatus of claim 6, further including a battery and a battery capacity detection circuit;
 wherein the conversion coefficients are increased when the battery capacity detection circuit indicates that the battery capacity is less than a predetermined value.

8. An organic light emitting diode (OLED) display apparatus, comprising:
 (a) a calculation section to calculate the average brightness or electric power necessary for display of a color image from input image data of one screen, wherein the color image includes an input RGB signal for each of a plurality of pixels;
 (b) a calculation circuit connected to the calculation section to receive the average brightness or electric power and to calculate a respective conversion coefficient between 0 and 1 for each pixel in accordance with the result of such calculation;
 (c) a conversion circuit connected to the calculation circuit to receive the respective conversion coefficient and to convert the input RGB signals for each pixel to RGBW signals for that pixel using the respective conversion coefficient; and
 (d) a plurality of pixels, each having a R (red), a G (green), a B (blue), and a W (white) dot to produce light in response to the corresponding RGBW signals, so that when the conversion coefficient for a pixel is less than 1, the R, G, B and W dots in the pixel all emit light simultaneously.

9. The organic light emitting diode (OLED) display apparatus of claim 8, wherein the conversion coefficient is calculated to adaptively change the usage ratio of the W dots depending on the spatial position of the W dot.

10. An organic light emitting diode (OLED) display apparatus, comprising:
- (a) a calculation section to detect an electric current flowing through the OLED for achieving display in accordance with input image data, wherein the color image includes an input RGB signal for each of a plurality of pixels;
- (b) a calculation circuit connected to the calculation section to receive the electric current and to calculate a respective conversion coefficient between 0 and 1 for each pixel in accordance with the detected electric current and the spatial position of the pixel;
- (c) a conversion circuit connected to the calculation circuit to receive the respective conversion coefficient and to convert the input RGB signals for each pixel to RGBW signals for that pixel using the respective conversion coefficient; and
- (d) a plurality of pixels each having a R (red), a G (green), a B (blue), and a W (white) dot to produce light in response to the corresponding RGBW signals, so that when the conversion coefficient for a pixel is less than 1, the R, G, B and W dots in the pixel all emit light simultaneously, wherein the conversion coefficient determines a usage ratio of the W dot.

11. The OLED display apparatus according to any one of claims 1-5, 6, 8 and 10, wherein the conversion coefficient is calculated based on response characteristics of a two-dimensional high pass filter with respect to a unit impulse, response characteristics of a two-dimensional low pass filter with respect to a unit impulse, and a signal level corresponding to a dot at the spatial position.

* * * * *